United States Patent [19]

Lamarche

[11] Patent Number: 4,918,326
[45] Date of Patent: Apr. 17, 1990

[54] ELECTRONIC SWITCHGEAR, PREFERABLY OPERATING CONTACT-FREE

[75] Inventor: Jean-Luc Lamarche, Langenargen, Fed. Rep. of Germany

[73] Assignee: I F M Electronic GmbH, Essen, Fed. Rep. of Germany

[21] Appl. No.: 216,172

[22] Filed: Jul. 7, 1988

[30] Foreign Application Priority Data

Jul. 7, 1987 [DE] Fed. Rep. of Germany ....... 3722335

[51] Int. Cl.$^4$ ............................................ H01H 35/00
[52] U.S. Cl. ........................................ 307/116; 361/179
[58] Field of Search ............... 307/116, 117; 361/139, 361/160, 180, 179; 340/600; 324/236, 239; 363/126; 323/351; 331/65; 328/5

[56] References Cited

U.S. PATENT DOCUMENTS

| | | | |
|---|---|---|---|
| 4,031,408 | 6/1977 | Holz | 307/116 |
| 4,138,709 | 2/1979 | Colwill | 328/5 X |
| 4,336,491 | 6/1982 | Buck et al. | 328/5 X |
| 4,543,527 | 9/1985 | Schuchmann et al. | 324/207 |
| 4,663,542 | 5/1987 | Buck et al. | 307/308 |
| 4,672,230 | 6/1987 | Spahn | 307/116 |
| 4,731,548 | 3/1988 | Ingraham | 307/116 |
| 4,757,341 | 7/1988 | Tanigawa | 307/308 X |
| 4,792,764 | 12/1988 | Walker et al. | 328/5 |

FOREIGN PATENT DOCUMENTS 0169583 1/1986 European Pat. Off. .
3536925 4/1987 Fed. Rep. of Germany .

OTHER PUBLICATIONS

Patent Abstracts of Japan E-109 May 28, 1982, vol. 6, No. 91.

Primary Examiner—William M. Shoop, Jr.
Assistant Examiner—Sharon D. Logan
Attorney, Agent, or Firm—Browdy and Neimark

[57] ABSTRACT

An electronic switchgear operating contact-free, having a presence indicator which can be externally affected, a switching amplifier disposed downstream of the presence indicator an electronic switch controllable by the presence indicator via the switching amplifier a supply circuit for the provision of the supply voltage for the presence indicator and for the switching amplifier and a delay circuit preventing activating pulses. The supply circuit has a voltage and/or current regulator. In the electronic switchgear in accordance with the invention activating pulses are prevented with a higher degree of assurance than in the state of the art, namely based on the fact that the delay circuit becomes active, i.e. the delay time starts, only after the voltage and/or current regulator has started to operate.

15 Claims, 2 Drawing Sheets

ELECTRONIC SWITCHGEAR, PREFERABLY OPERATING CONTACT-FREE

BACKGROUND OF THE INVENTION

1. Field of the Invention

The invention relates to an electronic switchgear, preferably operating contact-free, having a presence indicator capable of being externally affected, e.g. an oscillator, a switching amplifier disposed downstream of the presence indicator, an electronic switch, e.g. a transistor, a thyristor or a triac, which can be controlled by the presence indicator via the switching amplifier, a supply circuit for the provision of the supply voltage for the presence indicator and for the switching amplifier and a delay circuit inhibiting activation pulses.

2. The Prior Art

Electronic switchgear of the type basically addressed herein is contact-less and has been increasingly used for approximately twenty years in place of electrical, mechanically activated switchgear with contacts, in particular in connection with electrical or electronic measurement, open or closed loop control circuits. This is true in particular for so called proximity switches, i.e. for electronic switching gear which operates contact-free. An indication is given by means of such proximity switches whether an activating element to which the corresponding proximity switch is sensitive has come sufficiently close to the proximity switch. If an activating element to which the corresponding proximity switch is sensitive, has come sufficiently close to the proximity switch, the presence indicator forming an essential part of the proximity switch reverses the electronic switch and in a switchgear acting as a closing element the nonconducting electronic switch now becomes conducting, while in a switchgear acting as an opener the conducting electronic switch now inhibits. (By means of switch gear of the type under discussion it is also possible to indicate whether a physical quantity of an activating medium to which the switchgear is sensitive has reached a corresponding value.) Therefore, the presence indicator which can be externally actuated is, among others, an essential component of electronic switchgear of the type previously described. For example, an inductively or capacitively actuable oscillator can be provided as a presence indicator; these are inductive or capacitive proximity switches (see, for example, German Non-examined or Examined Published Applications or Patent Nos. 19 51 137, 19 66 178, 19 66 213, 20 36 840, 21 27 956, 22 03 038, 22 03 039, 22 03 040, 22 03 906, 23 30 233, 23 31 732, 23 56 490, 26 13 423, 26 16 265, 26 16 773, 26 28 427, 27 11 877, 27 44 785, 29 43 911, 30 04 829, 30 38 692, 31 20 884, 32 09 673, 32 38 396, 33 20 975, 33 26 440, 33 27 329, 34 20 236, 34 27 498, 35 19 714, 36 05 499 and 36 38 409). A photo resistor, a photo diode or a photo transistor can be provided as presence indicator; in this case these are optoelectronic proximity switches (see, for example, German Nonexamined Published Applications Nos. 28 24 582, 30 38 102, 33 27 328, 35 14 643, 35 18 025 and 36 05 885).

In connection with inductive proximity switches it is true for the oscillator, as long as a metallic part has not yet reached a pre-selected distance, that $K \times V = 1$, with $K$=feedback factor and $V$=amplification factor of the oscillator, i.e. the oscillator oscillates. When the respective metallic part has reached the pre-selected distance, the increasing damping of the oscillator leads to a reduction of the amplification factor V, so that $K \times V < 1$, i.e. the oscillator ceases to oscillate.

In connection with capacitive proximity switches it is true for the oscillator, as long as an actuating body has not sufficiently increased the capacitance between an actuating electrode and a backplate electrode, i.e. has not reached a preselected distance, that $K \times V < 1$, i.e. the oscillator does not oscillate. When the actuating body has reached the pre-selected distance, the increasing capacitance between the actuating electrode and the backplate electrode leads to an increase in the feedback factor K, so that $K \times V = \times 1$, i.e. the oscillator begins to oscillate.

In both embodiments, inductive proximity switch and capacitive proximity switch, the electronic switch, e.g. a transistor, a thyristor or a triac, is controlled depending on the different states of the oscillator. Optoelectronic proximity switches have a light emitter and a light receiver and are also called light barriers. Differentiation is made between the type of light barrier in which the light emitter and the light receiver are disposed at opposite ends of a monitoring course, and the type of light barrier in which the light emitter and the light receiver are disposed on the same end of a monitoring course and a reflector disposed at the opposite end of the monitoring course reflects the light beam emanating from the light emitter back to the light receiver. In either case the presence indicator reacts when the light beam normally traveling from the light emitter to the light receiver is disrupted by an activating element present in the monitoring course. However, there are also light barriers of the light barrier type previously discussed in which the light beam emanating from the light emitter is only reflected back to the light receiver by a respective activating element.

In the beginning electronic contact-free switchgear was subject to a number of problems, in comparison with electrical mechanically actuated switchgear, namely among others "Provision of a Supply Voltage for the Presence Indicator and the Switching Amplifier", "Design of the Presence Indicator", "Resistance to Short Circuits" and "Activating Pulse Prevention". Addressing these problems and their solutions (as well as other problems and their solutions relating to electronic contact-free switchgear) are, for example, German Non-examined or Examined Published Applications or Patent Nos. (19 51 137, 19 66 178, 19 66 213, 20 36 840, 21 27 956, 22 03 039, 22 03 040, 22 03 906, 23 30 233, 23 31 732, 23 56 490, 26 13 423, 26 16 265, 26 16 773, 26 28 427, 27 11 877, 27 44 785, 29 43 911, 30 04 829, 30 38 102, 30 38 141, 30 38 692, 31 20 884, 32 05 737, 32 09 673, 32 14 836, 32 38 396, 33 20 975, 33 26 440, 33 27 328, 33 27 329, 34 20 236, 34 27 498, 35 19 714, 35 29 827, 36 05 199, 36 05 885 and 36 38 409).

In connection with electronic switchgear, which can be connected via an external conductor with one terminal of a supply voltage source and only via another external conductor with a connection of a consumer, the provision of the supply voltage or supply current for the presence indicator and for the switching amplifier is not without problems, because the supply voltage or the supply current must be provided in the conducting state as well as in the inhibited state of the switchgear.

It is of no consequence whether the provision of a supply voltage or of a supply current is addressed. Here, provision represents derivation from the voltage drop occurring at the switchgear, or from the operating current conducted via the switchgear (conducting state), or from the operating voltage present at the switchgear or from the residual current flowing across the switchgear (inhibited state). Therefore it is of no consequence whether the provision of a supply voltage or the provision of a supply current is addressed, because the presence indicator and the switching amplifier of course require a supply voltage and a supply current.

Based on its operation as switchgear, practically no voltage drop should occur in the switchgear herein discussed in the conductive state and practically no residual current should flow in the inhibited state. However since, if no voltage drop is allowed to occur in the conductive state in switchgear with only two external conductors, no supply voltage for the presence indicator and the switching amplifier could be obtained and, if no residual current is allowed to flow in the inhibited state, no supply current could be obtained, it is true for all electronic switchgear with only two external conductors that in the conductive state a voltage drop occurs and in the inhibited state a residual current flows.

It follows from what has been stated above that the voltage drop and the residual current should be as small as possible, even though in electronic switchgear with only two external conductors a voltage drop occurs in the conductive state and a residual current flows in the inhibited state in a way which is unintentional but necessary for the operation. In the beginning it was stated that, among others, a switching amplifier, placed downstream from the presence indicator, and an electronic switch are associated with the electronic switchgear on which the invention is based, and that the electronic switch can be controlled via the switching amplifier by the presence indicator. The term switching amplifier is to be understood in a general way and encompasses the entire circuit between the signal output of the presence indicator and the control input of the electronic switch, thus the entire signal transmission path between the presence indicator and the electronic switch. Of course, the switching amplifier understood in this manner or the signal transmission path may consist of a plurality of operational units.

The following is true for electronic switchgear of the type discussed here, having an oscillator as presence indicator. When such switchgear is connected to the operating voltage source, the switching amplifier is already operational, without the need for particular steps, when the oscillator is not yet operational. Actually the oscillator requires a certain amount of time, after the voltage supplied to it has reached the required minimum value, to build up oscillations, while the switching amplifier is operational practically immediately after the voltage supplied to it has reached the required minimum value. This has the result that, when such switchgear is connected to the operating voltage source, an effect is simulated, namely damping of the oscillator, and that the switchgear reacts accordingly, i.e. with switchgear acting as a closing element the electronic switch becomes conductive and in switchgear acting as an opener the electronic switch inhibits. The phenomenon described above already was recognized about twenty years ago and has been generally called "Appearance of Activating Pulses". Such activating pulses can be prevented by means of a delay circuit. Consequently a delay circuit preventing activating pulses is also part of the electronic switchgear from which the invention proceeds.

It was stated above that the described activating pulses occur when the presence indicator is in the form of an oscillator. However, activating pulses also occur when the presence indicator is other than an oscillator, namely in all cases where the presence indicator requires a certain length of time to be operational. Electronic switchgear having an oscillator as a presence indicator is always described below. However, what has been said is true in general, namely for all electronic switchgear of the type here discussed having a presence indicator requiring a certain length of time to become operational.

In the devices according to the state of the art the delay circuit which prevents activating pulses was first connected directly to the signal transmission path, between the presence indicator and the electronic switch (see Japanese Utility Model JP-GM 42-2278 and German Examined Published Application DE-AS 20 54 100). This is disadvantageous, because the delay circuit is not only activated when such switchgear is connected to the operating voltage source, but is continuously operational and thus limits the maximum switching cycle of such switchgear. The disadvantage described above was already noted in 1973 and therefore electronic switchgear of the type under discussion was developed in which the delay circuit is placed upstream of the switching amplifier or of an operational element of the switching amplifier in the supply voltage (see German Examined Published Application DE-AS 23 56 490). This assures that the delay circuit is operational when such switchgear is connected to the operating voltage source so that the maximum switching cycle of the switchgear is not influenced. Equivalent thereto is another, also known, solution of the problem "Prevention of Activating Pulses" which is characterized in that an operational unit of the switching amplifier is in the form of an AND gate and in that the presence indicator, directly or by means of at least one additional operational unit of the switching amplifier, is connected to the first input of the AND gate and the delay circuit to the second input of the AND gate.

All solutions of the problem "Prevention of Activating Pulses" known in the prior art have the disadvantage that under certain conditions they still do no prevent activating pulses, namely, among others, when either the switchgear is repeatedly quickly connected to the operating voltage source, for example because of chattering contacts, or when the operating voltage source supplies a slowly increasing operating voltage.

SUMMARY OF THE INVENTION

It is therefore an object of the invention to develop and improve the known electronic switchgear on which the invention is based in such a way that activating pulses can be prevented with even greater assurance.

The electronic switchgear according to the invention by means of which the object previously derived and described in detail has been attained is first and most generally characterized in that the delay circuit only becomes active, i.e. the delay time only starts, after the supply voltage has attained a pre-selected minimum value or, in electronic switchgear with a supply voltage containing a voltage and/or current regulator in that the delay circuit only becomes active, i.e. the delay time only starts after the voltage and/or current regulator has started to work. In the electronic switchgear according to the invention the reasons for the defects ascribed above to the known electronic switchgear are eliminated by the delay circuit only becoming active, i.e. the delay time only starting, after the supply circuit for providing the supply voltage has made available the correct supply voltage for the oscillator and the switching amplifier.

In detail there are a number of possibilities for designing and improving the electronic switchgear according to the invention, which will be described only by way of example below.

In regard to realizing the delay circuit, a first embodiment of the electronic switchgear according to the invention is characterized in that the delay circuit, as known per se, is in the form of a series circuit consisting of a delay resistor and a delay condenser. However, an embodiment preferred in respect to the realization of the delay circuit is characterized in that the delay circuit consists of a delay condenser and a constant current generator charging the delay condenser. While the initial voltage at the output of the delay circuit, where the latter consists of a delay resistor and a delay condenser, increases in accordance with an exponential function, the initial voltage at the output of the delay circuit increases linearly in the case where the delay circuit consists of a delay condenser and a constant current generator charging the delay condenser.

In the preferred embodiment of the electronic switchgear in accordance with the invention where the delay circuit consists of a delay condenser and a constant current generator charging the delay condenser, it is advantageous if the constant current generator has a current mirror, an activating transistor and a triggering transistor controlling the activating transistor. In detail the base of the triggering transistor can either be connected to the control voltage via a voltage divider or to a connector of the voltage and/or current regulator containing a trigger signal when the voltage and/or current regulator is operating.

Furthermore, there are different possibilities for permitting the delay circuit which, in accordance with the invention only is activated when certain conditions are present, to become itself active. The delay circuit may be directly connected to the signal transmission path between the presence indicator and the electronic switch. However, this has the disadvantage mentioned in connection with the state of the art. Therefore, as already known per se, it is recommended to switch the delay circuit upstream, in respect to the supply voltage, of the switching amplifier or an operational unit of the switching amplifier or to let the delay circuit, as known per se, release the signal transmission path with a time delay in another way. In particular, an operational unit of the switching amplifier can be in the form of an AND gate and the presence indicator can be, directly or via at least one further operational unit of the switching amplifier, connected to the first input of the AND gate and the delay circuit to the second input of the AND gate. Finally, a preferred embodiment of the electronic switch gear according to the invention is further characterized in that the output of the delay circuit is connected to a threshold value switch, the threshold value switch then connecting the switching amplifier or the corresponding operational unit(s) of the switching amplifier with the supply voltage, or releasing the corresponding operational units(s) of the switching amplifier, at the time when the output voltage at the output of the delay circuit has reached a pre-set minimum value.

BRIEF DESCRIPTION OF THE DRAWINGS

The invention is described in detail below by means of the drawings showing only one exemplary embodiment, in which.

DETAILED DESCRIPTION OF A PREFERRED EMBODIMENT

Figure 1:
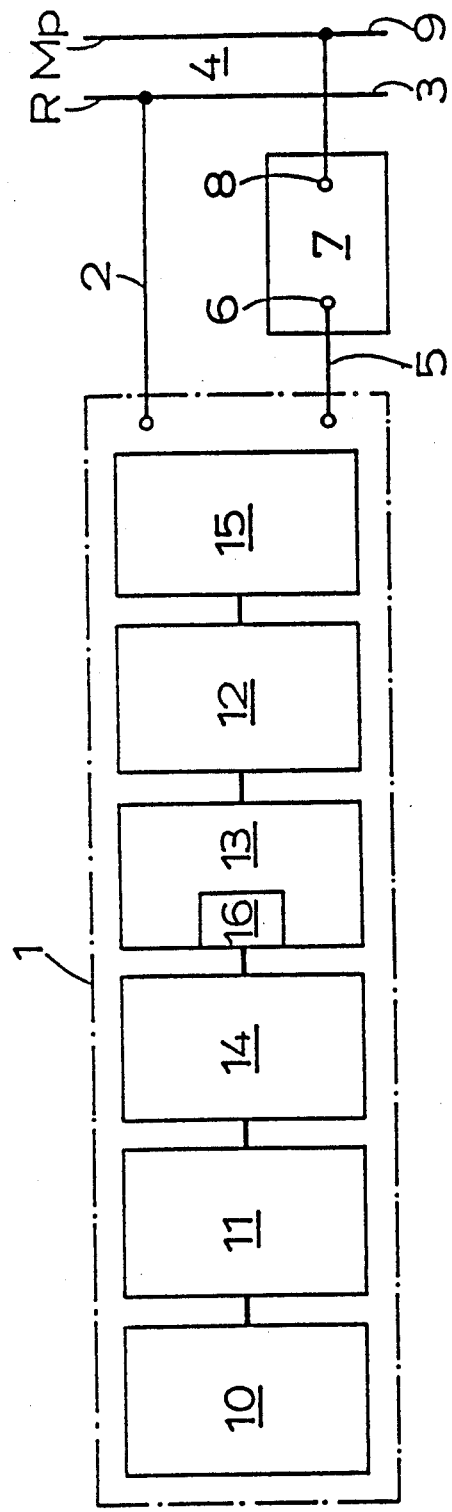
FIG. 1 is a block circuit diagram of electronic switchgear operating contact-free.

The electronic switchgear 1, shown in FIG. 1 by means of a block circuit diagram, operates contact-free, i.e. it reacts to, for example, an approaching metallic element, not shown, and, in the exemplary embodiment shown, is connected via an external conductor 2 with a terminal 3 of an operating voltage source 4 and via another external conductor 5 to a connector 6 of a consumer 7, the other connector 8 of the consumer 7 being connected to the other terminal 9 of the operating voltage source 4. In other words, the switchgear 1 shown is connected in a known manner via a total of only two external conductors 2, 5 to the operating voltage source 4 on the one hand and, on the other, to the consumer 7.

As shown in FIG. 1, the switchgear 1 consists in its basic structure of a presence indicator 10 which can be externally affected for example an oscillator, a switching amplifier 11 placed downstream of the presence indicator 10, an electronic switch 12, for example a thyristor, controllable by the presence indicator 10 via the switching amplifier 11, a supply circuit 13 for the provision of the supply voltage for the presence indicator 10 and the switching amplifier 11, and a delay circuit 14 which prevents activating pulses. Furthermore, a rectifier bridge 15 is provided at the input because the operating voltage source 4 is an AC voltage source.

Figure 2:
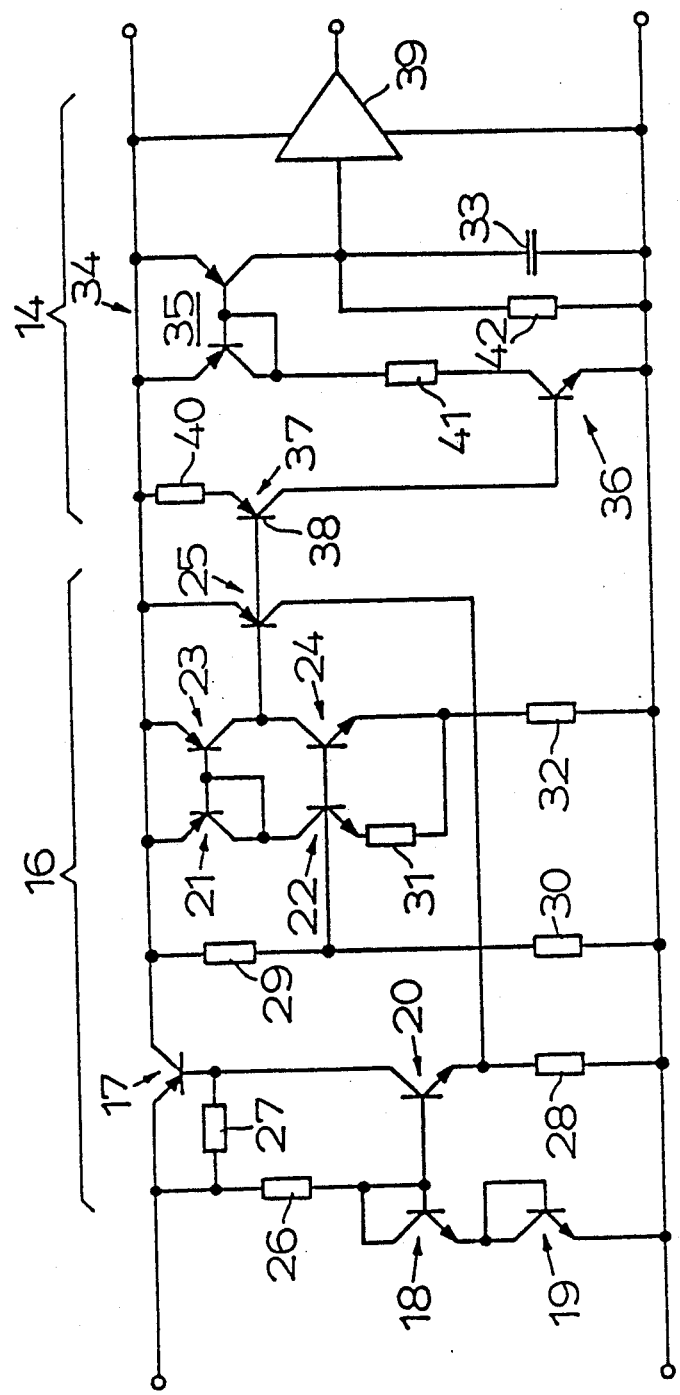
FIG. 2 is a detailed portion of the switchgear according to FIG. 1, namely a circuit diagram of the voltage regulator of the supply circuit for the provision of the supply voltage for the presence indicator and the switching amplifier and of the delay circuit preventing activating pulses.

The teaching of the invention does not relate to the design of the presence indicator 10 and of the switching amplifier 11, therefore the drawings do not show their details. The German Non-Examined Patent Applications DE-OS 19 51 137, 19 16 178, 19 16 213, 20 36 840, 22 03 039 and 22 03 040 (in connection with the presence indicator 10) or DE-OS 19 51 137 and 22 03 906 (in connection with the switching amplifier 11) show possible and preferred embodiments of the presence indicator 10 or the switching amplifier 11 for the electronic switchgear 1. In the exemplary embodiment of an electronic switchgear 1 shown in FIG. 1 and 2 the supply voltage 13 has a voltage and/or current regulator 16 for the provision of the supply voltage for the presence indicator 10 and the switching amplifier 11. This is only suggested in FIG. 1, while FIG. 2 shows a possible embodiment of such a voltage and/or current regulator 16. Control transistors 17, 18, 19, 20, 21, 22, 23, 24 and 25 as well as control resistors 26, 27, 28, 29, 30, 31 and 32 are associated with the voltage and/or current regulator 16 shown in detail in FIG. 2.

In accordance with the invention the delay circuit 14 becomes active, i.e. the delay time starts only after the voltage and/or current regulator has begun to operate. In the switchgear 1 according to the invention the delay time only starts after the supply circuit 13 for the provision of the supply voltage provides the correct supply voltage for the oscillator 10 and the switching amplifier 11.

In the exemplary embodiment shown, the delay circuit 14 which prevents activation pulses consists of a delay condenser 33 and a constant current generator 34 charging the delay condenser 33. In detail, the constant current generator 34 has a current mirror 35, an activation transistor 36 is associated with the constant current generator 34 and the activation transistor 36 is controlled by a triggering transistor 37.

The base 38 of the triggering transistor 37 is connected to a connector of the voltage and/or current regulator 16, which contains a trigger signal when the voltage and/or current regulator 16 is operational, i.e. it is connected to the base of the control transistor 25.

Furthermore, the output of the delay circuit 14 is connected to a threshold value switch 39 and the threshold value switch 39 connects the switching amplifier 11 with the supply voltage at the time when the output voltage at the output of the delay circuit 14 has reached a pre-selected minimum value. Finally, an emitter resistor 40 associated with the triggering transistor 37, a collector resistor 41 associated with the activating transistor 36 and a discharge resistor 42 associated with the delay condenser 33 are parts of the delay circuit 14 shown in detail in FIG. 2.

The exemplary embodiment described above has been given by way of example only and other variants and improvements are possible within the scope of the invention.

What is claimed is:

1. An electronic switchgear, preferably operating contact-free, comprising a presence indicator capable of being externally affected, a switching amplifier disposed downstream of the presence indicator, an electronic switch which can be controlled by the presence indicator via the switching amplifier, a supply circuit containing a voltage and/or current regulator for the provision of the supply voltage for the presence indicator and for the switching amplifier and a delay circuit interconnecting the switching amplifier or the electronic switch with the supply circuit and so inhibiting activation pulses, wherein the delay circuit becomes operational so as to start the delay time only after the voltage and/or current regulator has begun to operate and the supply circuit has made the correct supply voltage available for the presence indicator and the switching amplifier.

2. An electronic switchgear in accordance with claim 1, wherein said presence indicator comprises an oscillator, and said electronic switch is of a type selected from the group of a transistor, a thyristor, or a triac.

3. An electronic switchgear in accordance with claim 1, wherein the delay circuit comprises a series circuit consisting of a delay resistor and a delay condenser.

4. An electronic switchgear in accordance with claim 1, wherein the delay circuit consists of a delay condenser and a constant current generator charging the delay condenser.

5. An electronic switchgear in accordance with claim 3, wherein the constant current generator has a current mirror.

6. An electronic switchgear in accordance with claim 3, further comprising an activating transistor is associated with the constant current generator.

7. An electronic switchgear in accordance with claim 5, wherein the activating transistor is controlled by a triggering transistor.

8. An electronic switchgear in accordance with claim 6, wherein a base of the triggering transistor is connected with the supply circuit via a voltage divider.

9. An electronic switchgear in accordance with claim 7, wherein base of the triggering transistor is connected with a connector of the voltage and/or current regulator containing a trigger signal when the voltage and/or current regulator is operating.

10. An electronic switchgear in accordance with claim 1, wherein the delay circuit is connected directly to the signal transmission path between the presence indicator and the electronic switch.

11. An electronic switchgear in accordance with claim 1, wherein the delay circuit is connected upstream with respect to the supply voltage of the switching amplifier.

12. An electronic switchgear in accordance with claim 1, wherein the switching amplifier has a plurality of operational units, and the delay circuit is switched upstream of at least one operational unit of the switching amplifier.

13. An electronic switchgear in accordance with claim 1, wherein the switching amplifier has a plurality of operational units, and the delay circuit releases the signal transmission path of at least one operational unit of the switching amplifier after a time delay.

14. An electronic switchgear in accordance with claim 12, where an operational unit of the switching amplifier is in the form of an AND gate, the presence indicator is connected directly or via at least one further operational unit of the switching amplifier with the first input of the AND gate and the delay circuit is connected to the second input of the AND gate.

15. An electronic switchgear in accordance with claim 1, wherein an output of the delay circuit is connected with a threshold value switch and the threshold value switch then connects the switching amplifier or the corresponding operational unit(s) of the switching amplifier with the supply voltage, or releases the corresponding operational units(s) of the switching amplifier, at the time when the output voltage at the output of the delay circuit has reached a pre-set minimum value.

* * * * *